United States Patent
Jung et al.

(10) Patent No.: US 8,592,238 B2
(45) Date of Patent: Nov. 26, 2013

(54) ARRAY SUBSTRATE FOR LIQUID CRYSTAL DISPLAY DEVICE AND METHOD OF FABRICATING THE SAME

(71) Applicant: LG Display Co., Ltd., Seoul (KR)

(72) Inventors: Dae Sung Jung, Seoul (KR); Young Sik Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/673,556

(22) Filed: Nov. 9, 2012

(65) Prior Publication Data

US 2013/0065339 A1     Mar. 14, 2013

Related U.S. Application Data

(62) Division of application No. 12/458,787, filed on Jul. 22, 2009, now Pat. No. 8,319,220.

(30) Foreign Application Priority Data

Dec. 26, 2008   (KR) .................. 10-2008-0134709

(51) Int. Cl.
   *H01L 21/00*     (2006.01)
(52) U.S. Cl.
   USPC .............. 438/34; 257/E21.411; 257/E33.062

(58) Field of Classification Search
   USPC ................. 438/34; 257/E21.411, E33.062
   See application file for complete search history.

(56) References Cited

U.S. PATENT DOCUMENTS 6,362,507 B1 *   3/2002   Ogawa et al. ................ 257/350
7,583,350 B2 *   9/2009   Chang et al. ................. 349/153

* cited by examiner

*Primary Examiner* — Stephen W Smoot
*Assistant Examiner* — Vicki B Booker
(74) *Attorney, Agent, or Firm* — McKenna Long & Aldridge LLP

(57) ABSTRACT

A method of fabricating a liquid crystal display device includes: a first step of attaching a polarizing plate to an outer surface of a liquid crystal panel; a second step of attaching a tape carrier package (TCP) to the liquid crystal panel; a third step of coating a resin onto a rear surface of the TCP and a connection portion of the liquid crystal panel and the TCP; a fourth step of inspecting the TCP and the liquid crystal display panel; a fifth step of inserting the liquid crystal panel into a transferring means; a sixth step of transferring the transferring means; a seventh step of extracting the liquid crystal panel from the transferring means; a eighth step of attaching the TCP to a printed circuit board (PCB); a ninth step of inspecting the PCB, the TCP and the liquid crystal panel; and a tenth step of assembling the liquid crystal panel and a backlight unit with a plurality of frames.

1 Claim, 7 Drawing Sheets

… (1/2)

ARRAY SUBSTRATE FOR LIQUID CRYSTAL DISPLAY DEVICE AND METHOD OF FABRICATING THE SAME

This application is a divisional application of U.S. patent application Ser. No. 12/458,787, filed Jul. 22, 2009, which claims the benefit of Korean Patent Application No. 10-2008-0134709, filed in Korea on Dec. 26, 2008, which is hereby incorporated by reference in its entirety for all purposes as if fully incorporated herein.

BACKGROUND OF THE INVENTION

1. Field of the Invention

The present application relates to an array substrate for a liquid crystal display device, and more particularly, to an array substrate for a gate-in-panel (GIP) type liquid crystal display (LCD) device and a method of fabricating the array substrate.

2. Discussion of the Related Art

As information age progresses, flat panel display (FPD) devices having light weight, thin profile, and low power consumption have been substituted for cathode ray tube (CRT) devices. Liquid crystal display (LCD) devices, plasma display panel (PDP) devices, field emission display (FED) devices, and electroluminescent display (ELD) devices are examples of the FPD devices. Since the LCD devices have excellent characteristics in resolution, contrast ratio, color display and display quality, the LCD devices have been widely used in a notebook computer, a monitor and a television.

In general, an LCD device includes two substrates spaced apart and facing each other and a liquid crystal layer interposed between the two substrates. Each of the two substrates includes an electrode on a surface facing the other of the two substrates. A voltage is applied to each electrode to induce an electric field between the electrodes. The arrangement of the liquid crystal molecules as well as the transmittance of light through the liquid crystal layer is controlled by varying the intensity of the electric field, thereby the LCD device displaying images using the change in light transmittance.

The LCD device includes a liquid crystal panel having two substrates and a liquid crystal layer between the two substrates, a backlight unit under the liquid crystal panel and a driving circuit unit connected to the liquid crystal panel and the backlight unit. The driving circuit unit includes a printed circuit board (PCB), a gate driving circuit supplying a gate signal to a gate line of the liquid crystal panel and a data circuit supplying a data signal to a data line of the liquid crystal panel. The gate driving circuit and the data driving circuit are formed as a tape carrier package (TCP) connected to the liquid crystal panel. For example, the gate TCP including the gate driving IC may be connected to a gate pad on the liquid crystal panel and the data TCP including the data driving IC may be connected to a data pad on the liquid crystal panel. The gate and data pads are connected to the gate and data lines, respectively.

Since weight and volume of the LCD device increase due to the gate TCP and the data TCP, a gate-in-panel (GIP) type LCD device where the gate driving circuit is formed in the liquid crystal panel and only the data TCP is connected to the liquid crystal panel has been suggested.

FIG. 1 is a cross-sectional view showing a gate-in-panel type liquid crystal display device according to the related art.

In FIG. 1, a gate-in-panel (GIP) type liquid crystal display (LCD) device 1 includes a first substrate 10, a second substrate 50 and a liquid crystal layer 70. The first and second substrates 10 and 50 face and are spaced apart from each other, and the liquid crystal layer 70 is interposed between the first and second substrates 10 and 50. The first and second substrates 10 and 50 include an active area AA displaying images and a non-active area NA surrounding the active area AA.

A gate line (not shown) and a data line 28 are formed on an inner surface of the first substrate 10 in the active area AA. The gate line and the data line 28 cross each other to define a pixel region P. A pixel thin film transistor (TFT) Tp connected to the gate line and the data line 28 is formed in each pixel region P. The pixel TFT Tp includes a gate electrode 15, a gate insulating layer 21, a semiconductor layer 23, a source electrode 30 and a drain electrode 32. The gate electrode 15 is connected to the gate line, and the gate insulating layer 21 is formed on the gate electrode 15. The semiconductor layer 23 on the gate insulating layer 21 includes an active layer 23a and an ohmic contact layer 23b, and the source and drain electrodes 30 and 32 on the semiconductor layer 23 are spaced apart from each other. The source electrode 30 is connected to the data line 28. A passivation layer 38 is formed on the data line 28, the source electrode 30 and the drain electrode 32, and a pixel electrode 43 is formed on the passivation layer 38. The passivation layer 38 includes a drain contact hole 41 exposing the drain electrode 32 and the pixel electrode 43 is connected to the drain electrode 32 of the pixel TFT Tp through the drain contact hole 41.

A gate driving circuit (not shown) including a plurality of circuit units (not shown) and an electrostatic discharge circuit between the adjacent circuit units are formed on the inner surface of the first substrate 10 in the non-active area NA. Each of the plurality of circuit units and the electrostatic discharge circuit includes a driving TFT Td having a gate electrode 16, the gate insulating layer 21, a semiconductor layer 24, a source electrode 34 and a drain electrode 36. The passivation layer 38 is formed on the driving TFT Td.

In addition, a black matrix 53 is formed on an inner surface of the second substrate 50. The black matrix 53 includes a first black matrix 53a having openings in the active area AA and a second black matrix 53b in the non-active area NA. A color filter layer 58 including red, green and blue color filters 58a, 58b and 58c is formed on the inner surface of the second substrate 50 and the first black matrix 53a in the active area AA such that the red, green and blue color filters 58a, 58b and 58c correspond to openings of the first black matrix 53a. A common electrode 60 is formed on the second black matrix 53b in the non-active area NA and the color filter layer 58 in the active area AA.

The liquid crystal layer 70 is formed between the pixel electrode 43 and the common electrode 60. Further, a seal pattern 80 is formed between the passivation layer 38 and the common electrode 60 in the non-active area NA, and a column spacer 63 is formed between the passivation layer 38 and the common electrode 60 in the active area AA to correspond to the first black matrix 53a.

FIG. 2 is a plan view showing a driving thin film transistor of a gate-in-panel type liquid crystal display device according to the related art.

In FIG. 2, a driving thin film transistor (TFT) Td of each of a plurality of circuit units and an electrostatic discharge circuit in a non-active area NA includes a gate electrode 16, a semiconductor layer 24, a source electrode 34 and a drain electrode 36. Each of the gate electrode 16 and the semiconductor layer 24 has a plate shape. In addition, each of the source electrode 34 and the drain electrode 36 has a comb shape including a horizontal portion 34a and 36a and a plurality of vertical protrusions 34b and 36b extending from the horizontal portion 34a and 36a. The plurality of vertical portions 34b of the source electrode 34 alternate with the plurality of vertical portions 36b of the drain electrode 36. Furthermore, the plurality of vertical portions 34b of the source electrode 34 are spaced apart from the plurality of vertical portions 36b of the drain electrode 36 to define a channel region CH as a current path. The channel region CH has a channel width W and a channel length L. Since the driving TFT Td in the non-active area NA is required to have a relatively high on-current, the driving TFT Td is formed to have a relatively great channel width W of the channel region CH and have a relatively great size of the gate electrode 16 covering the channel region CH. As a result, most of the non-active area NA is occupied with the driving TFT Td having a relatively great size.

The GIP type LCD device 1 is fabricated through a first process of forming the pixel TFT Tp, the driving TFT Td and the pixel electrode 43 on the first substrate 10, a second process of forming the black matrix 53, the color filter layer 58 and the common electrode 60 on the second substrate 50, and a third process of attaching the first and second substrates 10 and 50 and forming the liquid crystal layer 70 between the first and second substrates 10 and 50. The third process may be referred to as a cell process. For example, the cell process may include a step of forming alignment layer on each of inner surfaces of the first and second substrates 10 and 50, a step of forming a cell gap by attaching the first and second substrates 10 and 50, a step of cutting the attached first and second substrates 10 and 50 into unit cells, and a step of injecting liquid crystal materials into each unit cells.

After the first and second substrates 10 and 50 are attached to each other using the seal pattern 80 and the attached first and second substrates 10 and 50 are cut into the unit cells, the liquid crystal materials may be injected into each unit cell in a vacuum state cell through an injecting method using a capillary phenomenon. However, the process time for forming the liquid crystal layer by the injecting method may be over about 10 hours.

To reduce the process time for forming the liquid crystal layer, a method using a vacuum dispensing and attaching apparatus has been suggested. In the method using the vacuum dispensing and attaching apparatus, the steps of dispensing and attaching are performed under a vacuum state. For example, after a seal pattern of ultra violet (UV) curable sealant is formed on one of the first and second substrates, the liquid crystal materials are dispensed onto the one of the first and second substrates. Next, the first and second substrates are aligned and attached, and a UV ray is irradiated onto the seal pattern for curing or hardening. Next, the attached first and second substrates are cut into a plurality of unit cells. Since the liquid crystal layer is formed by a dispensing method instead of an injection method, the process time for forming the liquid crystal layer is reduced. In addition, the seal pattern has a closed loop shape without an injection hole for the liquid crystal materials.

After the first and second substrates are attached, the UV ray is irradiated through the first substrate because the second substrate has a blocking pattern such as a black matrix at a portion corresponding to the seal pattern for preventing light leakage. For example, the ratio of an open area that does not include the blocking pattern to the whole area of the first substrate corresponding to the seal pattern may be required to be over about 50% for curing the seal pattern by the UV ray. In addition, as shown in FIGS. 1 and 2, since the driving TFT Td in the non-active area NA of the first substrate 10 of the GIP type LCD device 1 has a relatively great size, the UV ray does not passing through the non-active area NA of the first substrate 10 corresponding to the gate driving circuit. As a result, when the seal pattern 80 and the liquid crystal layer 70 is formed through the method using the vacuum dispensing and attaching apparatus in the GIP type LCD device 1, the seal pattern 80 is insufficiently cured. The insufficiently cured seal pattern 80 contacts and contaminates the liquid crystal layer 70.

SUMMARY OF THE INVENTION

Accordingly, embodiments of the invention are directed to an array substrate for a liquid crystal display device and a method of fabricating the array substrate that substantially obviate one or more of problems due to limitations and disadvantages of the related art.

An advantage of the invention is to provide an array substrate for a gate-in-panel type liquid crystal display device applicable to a method using a vacuum dispensing and attaching apparatus for a liquid crystal layer and an attachment.

Another advantage of the invention is to provide a method of fabricating a gate-in-panel type liquid crystal display device where steps of forming a liquid crystal layer and attaching first and second substrates are performed using a vacuum dispensing and attaching apparatus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, according to an aspect of the invention, an array substrate for a liquid crystal display device includes: a substrate having an active area displaying images and a non-active area surrounding the active area; a gate line and a data line on the substrate in the active area, the gate line and the data line crossing each other to define a pixel region; a pixel thin film transistor connected to the gate line and the data line; a pixel electrode in the pixel region and connected to the pixel thin film transistor; and at least one driving thin film transistor in the non-active area, the at least one driving thin film transistor including a gate electrode having a gate base portion and a plurality of gate bar portions extending from the gate base portion, a gate insulating layer on the gate electrode, a semiconductor layer on the gate insulating layer over the gate electrode, a source electrode on the semiconductor layer and a drain electrode spaced apart from the source electrode.

In another aspect, a method of fabricating an array substrate for a liquid crystal display device includes: forming a gate line, a first gate electrode and a second gate electrode on a substrate having an active area displaying images and a non-active area surrounding the active area, wherein the gate line and the first gate electrode connected to the gate line are disposed in the active area and the second gate electrode is disposed in the non-active area, and wherein the second gate electrode having a gate base portion and a plurality of gate bar portions extending from the gate base portion; forming a gate insulating layer on the gate line, the first gate electrode and the second gate electrode; forming first and second semiconductor layers on the gate insulating layer, the first and second semiconductor layers corresponding to the first and second gate electrodes, respectively; forming a data line, a first source electrode, a first drain electrode, a second source electrode and a second drain electrode on the gate insulating layer and the first and second semiconductor layers, wherein the data line crosses the gate line, wherein the first source and drain electrodes correspond to the first semiconductor layer, and wherein the second source and drain electrodes correspond to the second semiconductor layer; forming a passivation layer on the data line, the first source electrode, the first drain electrode, the second source electrode and the second drain electrode, the passivation layer having a drain contact hole exposing the first drain electrode; and forming a pixel electrode on the passivation layer, the pixel electrode connected to the first drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the illustrated embodiments of the present invention, which are illustrated in the accompanying drawings.

Figure 1:
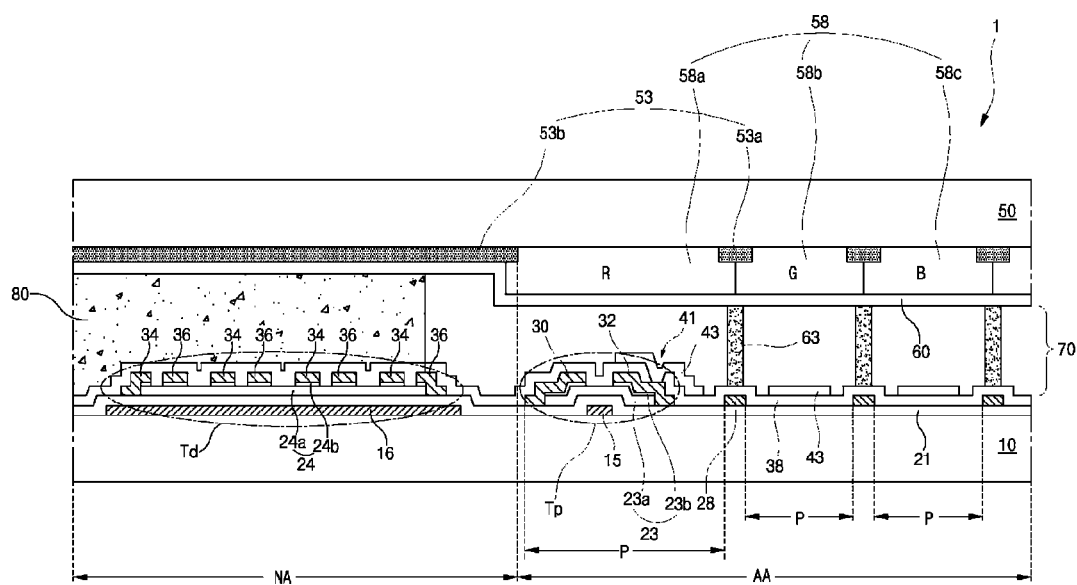
FIG. 1 is a cross-sectional view showing a gate-in-panel type liquid crystal display device according to the related art.
Figure 2:
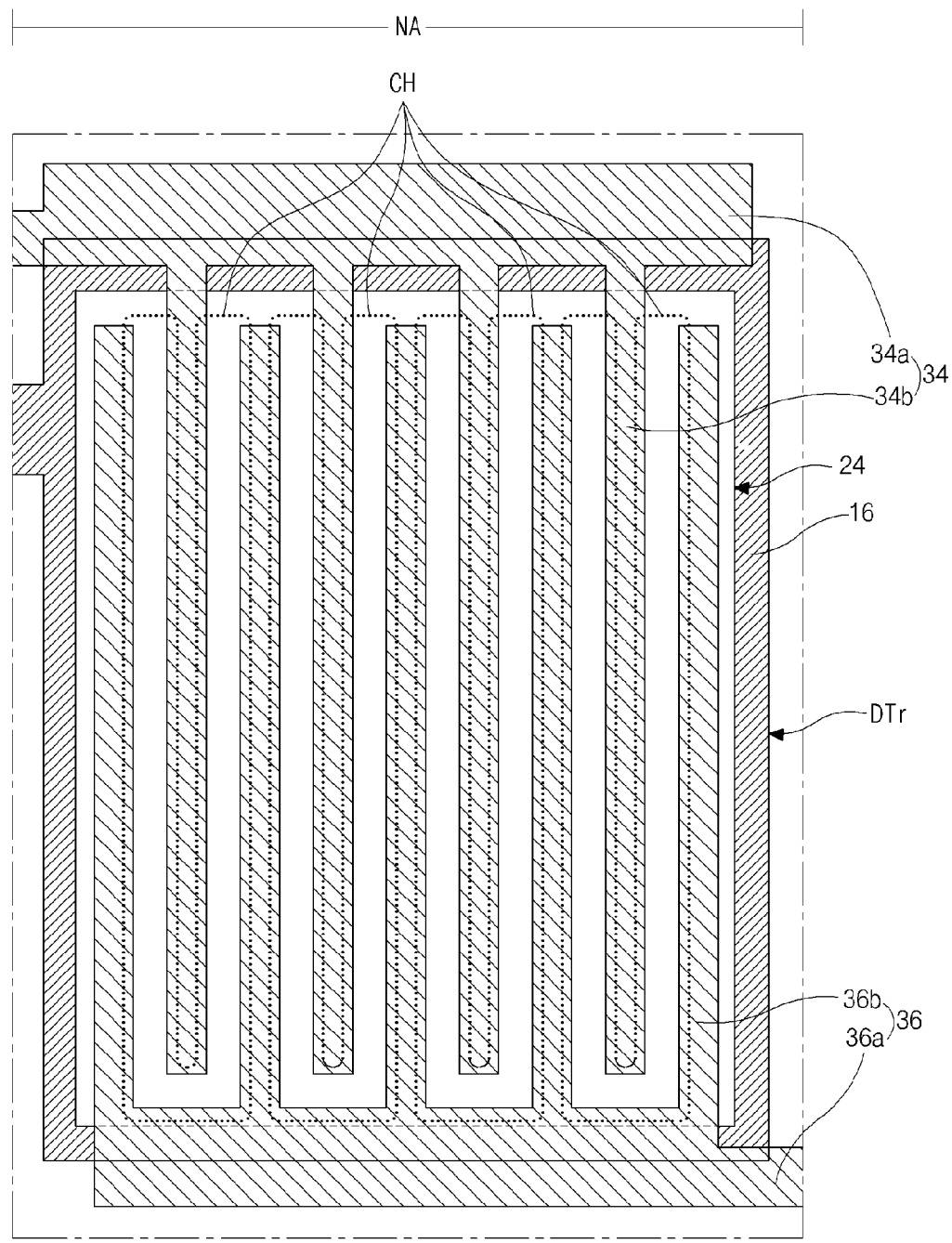
FIG. 2 is a plan view showing a driving thin film transistor of a gate-in-panel type liquid crystal display device according to the related art.
Figure 3:
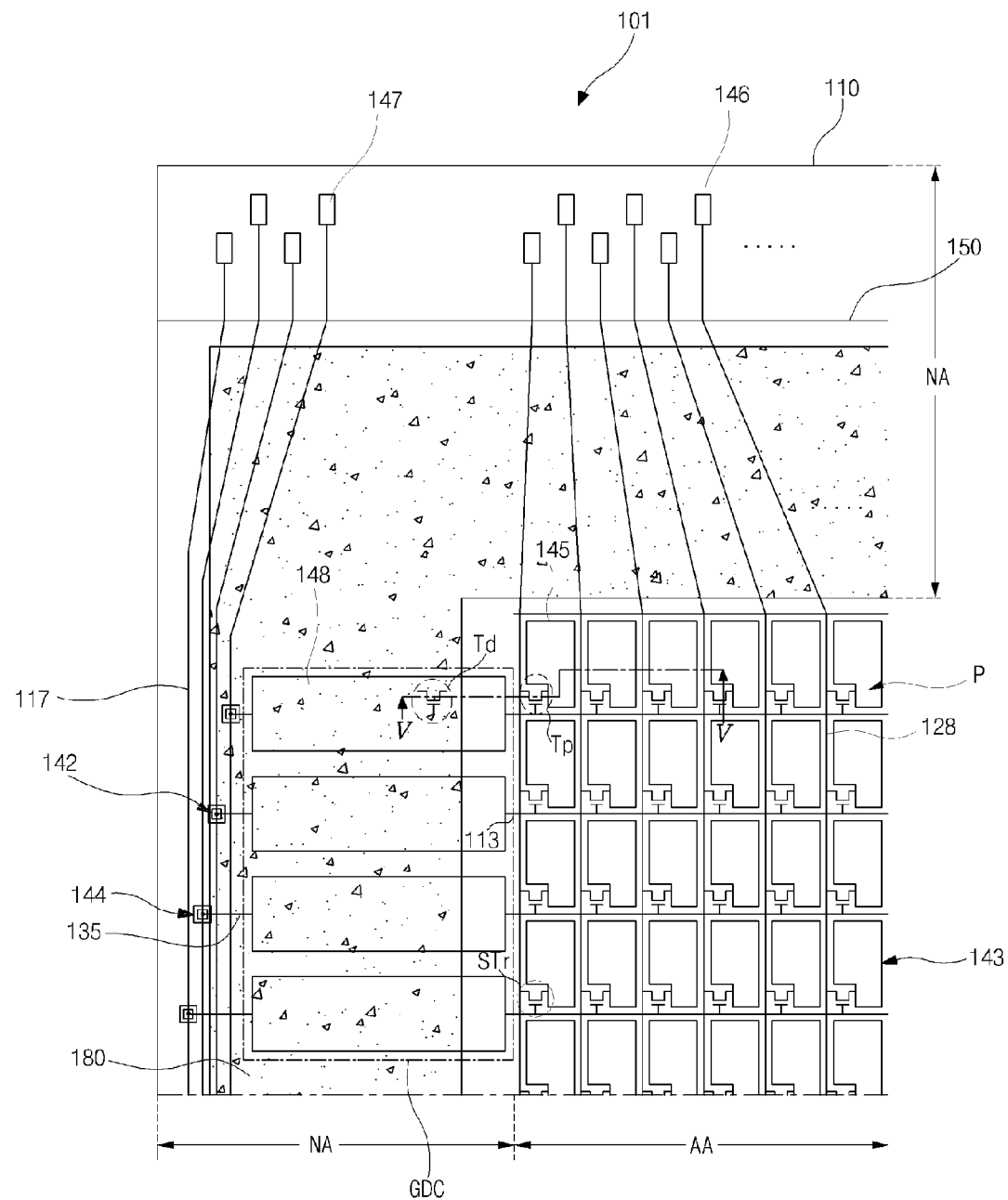
FIG. 3 is a plan view showing a gate-in-panel type liquid crystal display device according to an embodiment of the present invention.
Figure 4:
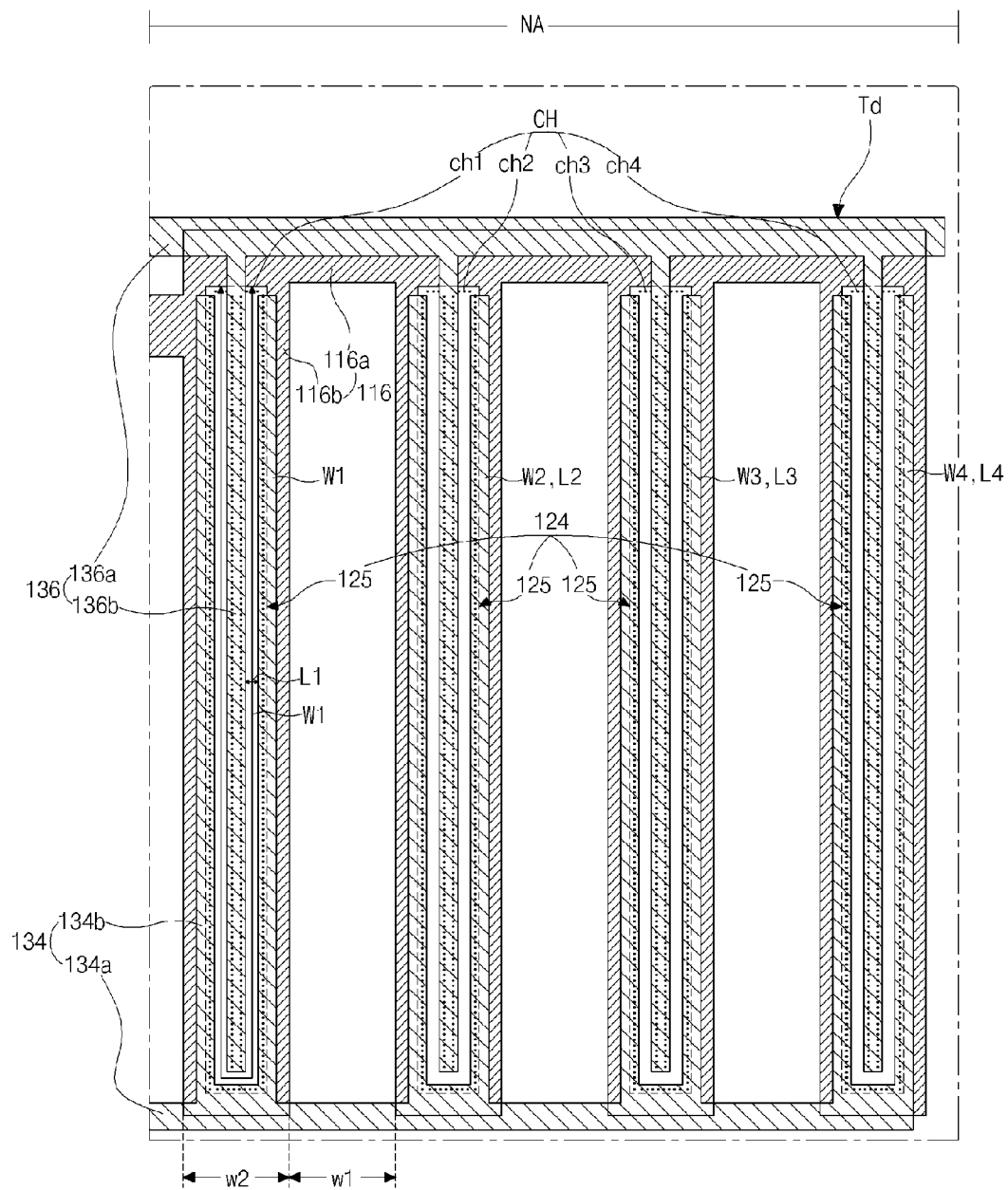
FIG. 4 is a plan view showing a driving thin film transistor of a gate-in-panel type liquid crystal display device according to an embodiment of the present invention.
Figure 5:
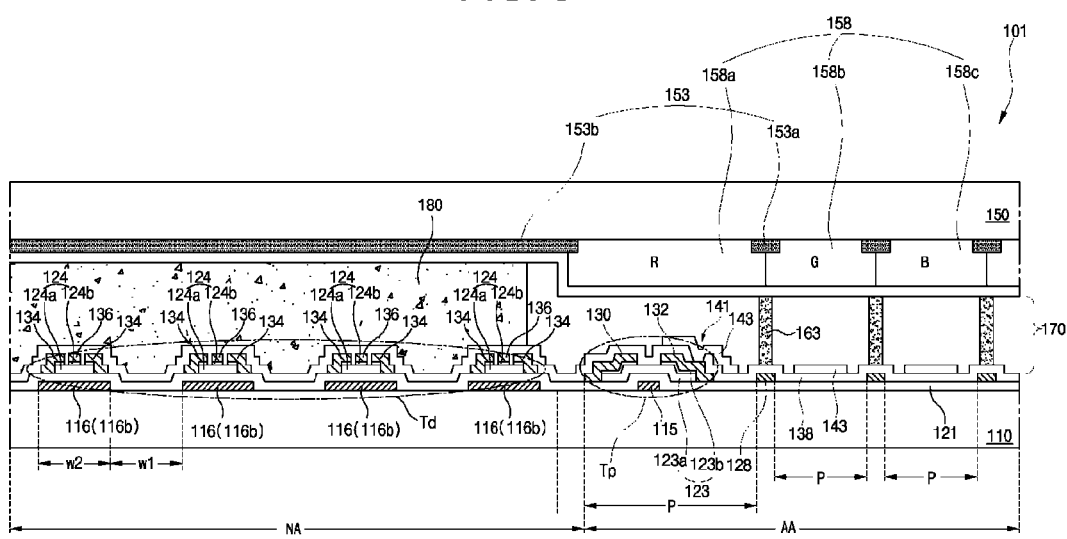
FIG. 5 is a cross-sectional view taken along a line V-V of FIG. 3.

FIG. 3 is a plan view showing a gate-in-panel type liquid crystal display device according to an embodiment of the present invention, FIG. 4 is a plan view showing a driving thin film transistor of a gate-in-panel type liquid crystal display device according to an embodiment of the present invention, and FIG. 5 is a cross-sectional view taken along a line V-V of FIG. 3. For simplicity, elements such as a black matrix, a color filter and a common electrode on a second substrate are omitted in FIG. 3.

In FIGS. 3, 4 and 5, a gate-in-panel (GIP) type liquid crystal display (LCD) device 101 includes a first substrate 110, a second substrate 150 and a liquid crystal layer 170. The first and second substrates 110 and 150 face and are spaced apart from each other, and the liquid crystal layer 170 is interposed between the first and second substrates 110 and 150. The first and second substrates 110 and 150 include an active area AA displaying images and a non-active area NA surrounding the active area AA.

A gate line 113 and a data line 128 are formed on an inner surface of the first substrate 110 in the active area AA. The gate line 113 and the data line 128 cross each other to define a pixel region P. A pixel thin film transistor (TFT) Tp connected to the gate line 113 and the data line 128 is formed in each pixel region P. The pixel TFT Tp includes a gate electrode 115, a gate insulating layer 121, a semiconductor layer 123, a source electrode 130 and a drain electrode 132. The gate electrode 115 is connected to the gate line 113, and the gate insulating layer 121 is formed on the gate electrode 115. The semiconductor layer 123 on the gate insulating layer 121 includes an active layer 123a and an ohmic contact layer 123b, and the source and drain electrodes 130 and 132 on the semiconductor layer 123 are spaced apart from each other. The source electrode 130 is connected to the data line 128. A passivation layer 138 is formed on the data line 128, the source electrode 130 and the drain electrode 132, and a pixel electrode 143 is formed on the passivation layer 138. The passivation layer 138 includes a drain contact hole 141 exposing the drain electrode 132 and the pixel electrode 143 is connected to the drain electrode 132 of the pixel TFT Tp through the drain contact hole 141.

A gate driving circuit GDC including a plurality of circuit units 148 and an electrostatic discharge circuit (not shown) are formed on the inner surface of the first substrate 110 in the non-active area NA. The gate driving circuit GDC generates and supplies a gate signal to the gate line 113 and the electrostatic discharge circuit prevents break of electric elements of the GIP type LCD device 101. For example, the electrostatic discharge circuit may be disposed between the adjacent circuit units 148, and each circuit unit may be connected to the gate line 113. Each of the plurality of circuit units 148 and the electrostatic discharge circuit includes a driving TFT Td having a gate electrode 116, the gate insulating layer 121 on the gate electrode 116, a semiconductor layer 124 on the gate insulating layer 121 and source and drain electrode 1 134 and 136 on the semiconductor layer 124. The semiconductor layer 124 includes an active layer 124a and an ohmic contact layer 124b on the active layer 124a, and the source and drain electrodes 134 and 136 are spaced apart from each other. In addition, the gate line 113 may be connected to one of the source and drain electrodes 134 and 136. The passivation layer 138 is formed on the driving TFT Td. Each circuit unit 148 may further include a capacitor.

Further, a connection line 135, a clock line 117 and a connection pattern 144 are formed on the first substrate 110 in the non-active area NA. The connection line 135 is connected to the each circuit unit 148 and may include the same layer as the data line 128. For example, the connection line 135 may be connected one of the source and drain electrodes 134 and 136 of the driving TFT Td. The clock line 117 crosses the connection line 135 and may include the same layer as the gate line 113. The connection pattern 144 is formed over a crossing portion of the connection line 135 and the clock line 117, and may include the same layer as the pixel electrode 143. Since the connection pattern 144 is connected to the connection line 135 and the clock line 117 through a connection contact hole 142, the clock line 117 is electrically connected to the connection line 135 through the connection pattern 144.

A seal pattern 180 is formed on the passivation layer 138 and the connection pattern 144 in the non-active area NA. Accordingly, the seal pattern 180 is formed over the gate driving circuit GDC, the connection line 135, the clock line 117 and the connection pattern 144. In addition, a data pad 146 and a clock pad 147 are formed over the first substrate 110 in the non-active area NA. The data pad 146 and the clock pad 147 are disposed at an outer portion of the seal pattern 180. The data line 128 is connected to the data pad 146 and the clock line 117 is connected to the clock pad 147. Since the second substrate 150 has a sized smaller than the first substrate 110, the data pad 146 and the clock pad 147 are exposed through the second substrate 150, and signals are applied to the data pad 146 and the clock pad 147. For example, a clock signal may supplied to the gate driving circuit through the clock pad 147, the clock line 117 and the connection line 135, and a data signal may be supplied to the source electrode 130 of the pixel TFT Tp through the data pad 146 and the data line 128. The gate driving circuit may generate a gate signal using the clock signal and may supply the gate signal to the gate electrode a data signal are supplied to the gate electrode 115 of the pixel TFT Tp.

A black matrix 153 is formed on an inner surface of the second substrate 150. The black matrix 153 includes a first black matrix 153a having openings in the active area AA and a second black matrix 153b in the non-active area NA. A color filter layer 158 including red, green and blue color filters 158a, 158b and 158c is formed on the inner surface of the second substrate 150 and the first black matrix 153a in the active area AA such that the red, green and blue color filters 158a, 158b and 158c correspond to openings of the first black matrix 153a. A common electrode 160 is formed on the second black matrix 153b in the non-active area NA and the color filter layer 158 in the active area AA.

The liquid crystal layer 170 is formed between the pixel electrode 143 and the common electrode 160. Further, the seal pattern 180 is formed between the passivation layer 138 and the common electrode 160 in the non-active area NA, and a column spacer 163 is formed between the passivation layer 138 and the common electrode 160 in the active area AA to correspond to the first black matrix 153a.

As shown in FIG. 4, the driving thin film transistor (TFT) Td includes the gate electrode 116, the semiconductor layer 124, the source electrode 134 and the drain electrode 136. The gate electrode 116 has a comb shape including a gate base portion 116a and a plurality of gate bar portions 116b extending from the gate base portion 116a. The plurality of gate bar portions 116b are spaced apart from each other. The semiconductor layer 124 includes a plurality of semiconductor bar portions 125 each having a plate shape and corresponding to each gate bar portion 116b. The plurality of semiconductor bar portions 125 are separated from each other to have an island shape. In addition, each of the source and drain electrodes 134 and 136 has a comb shape. The source electrode 134 includes a source base portion 134a and a plurality of source bar portions 134b extending from the source base portion 134a, and the drain electrode 136 includes a drain base portion 136a and a plurality of drain bar portions 136b extending from the drain base portion 136a. The plurality of source bar portions 134b and the plurality of drain bar portions 136b are spaced apart from each other such that two adjacent source bar portions 134b are disposed at both sides of one drain bar portion 136b to form a U-shaped gap therebetween. In another embodiment, a plurality of source bar portions and a plurality of drain bar portions may be spaced apart from each other such that two adjacent drain bar portions are disposed at both sides of one source bar portion to form an inverted-U-shaped gap therebetween.

The semiconductor layer 124 exposed through the two adjacent source bar portions 134b and the one drain bar portion 136b is defined as a channel region CH for a current path. For example, the channel region CH may include first to fourth channels ch1, ch2, ch3 and ch4 each having a U shape. The first channel ch1 has a first channel width W1 and a first channel length L1, and the second channel ch2 has a second channel width W2 and a second channel length L2. Similarly, the third channel ch3 has a third channel width W3 and a third channel length L3, and the fourth channel ch4 has a fourth channel width W4 and a fourth channel length L4. A channel width W of the channel region CH is a sum of the first to fourth channel width W1, W2, W3 and W4 (W=W1+W2+W3+W4) and a channel length of the channel region CH is an average of the first to fourth channel lengths L1, L2, L3 and L4 (L=(L1+L2+L3+L4)/4). When the first to fourth channels have the same width and the same length (W1=W2=W3=W4, L1=L2=L3=L4), the channel width and channel length of the channel region CH are four times of the first channel width and the first channel length, respectively (W=4W1, L=L1).

Since the driving TFT Td in the non-active area NA is required to have a relatively high on-current, the driving TFT Td is formed to have a relatively great channel width W of the channel region CH. However, since the plurality of gate bar portions 116b of the gate electrode 116 are spaced apart from each other, a ratio of an open area that a UV ray penetrate to a whole area corresponding to the driving TFT Td is greater than or equal to about 50%. For example, the ratio of the open area to the whole area may be within a range of about 50% to about 60%. When the ratio of the open area to the whole area is greater than about 60%, the area for the gate driving circuit is enlarged and the non-active area is also enlarged. As a result, compactness of the GIP type LCD device is deteriorated. For the ratio of the open area to the whole area within a range of about 50% to about 60%, the gate electrode 116 is formed such that a first width w1 between two adjacent gate bar portions 116b is greater than or equal to a second width w2 of each gate bar portion 116b (w1≥w2). For example, the first width w1 may be greater than the second width w2 by a value within a range of about 0% to about 10% of the second width w2 ((1.1*w2)≥w1≥w2). Although not shown, a third width between two adjacent gate electrodes of the adjacent driving TFTs Td may be greater than or equal to the first width w1.

All switching element such as a TFT in each circuit unit 148 and the electrostatic discharge circuit may be formed to have the structure of the driving TFT Td. Since the ratio of the open area to the whole area is greater than or equal to about 50%, the UV ray penetrates the first substrate 110 having the gate driving circuit in a subsequent process and the seal pattern 180 is sufficiently cured by the UV ray.

Figure 6:
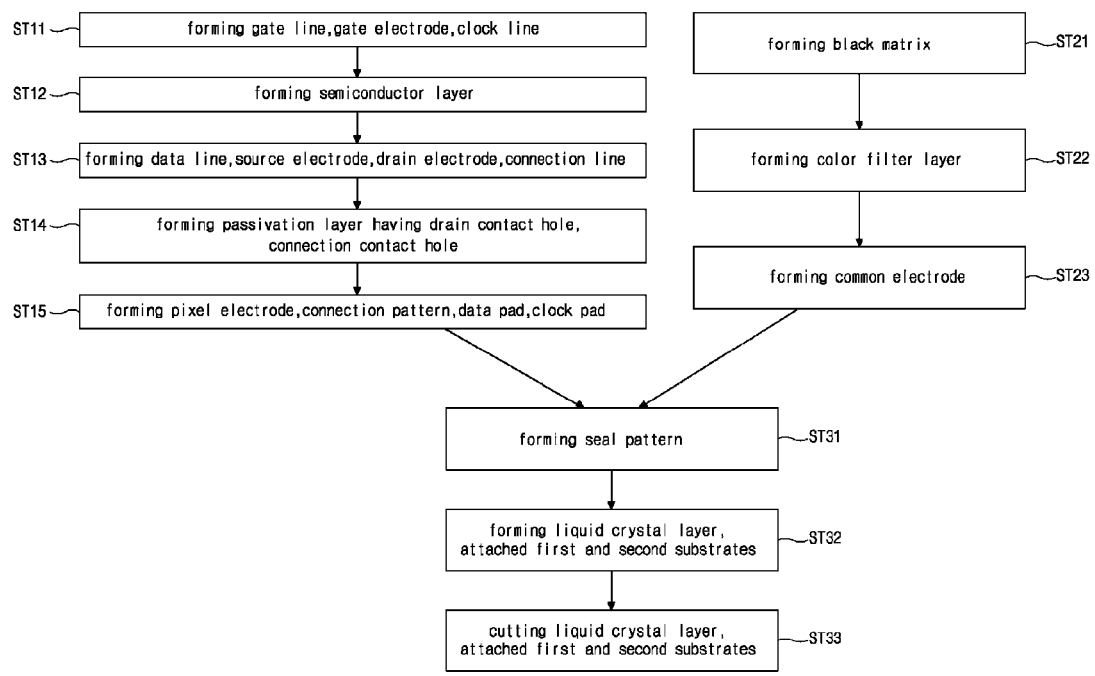
FIG. 6 is a flow chart showing a method of fabricating a gate-in-panel type liquid crystal display device according to an embodiment of the present invention.

FIG. 6 is a flow chart showing a method of fabricating a gate-in-panel type liquid crystal display device according to an embodiment of the present invention.

In FIG. 6, an array substrate is fabricated through steps ST11 to ST15 and a color filter substrate is fabricated through steps ST21 to ST23. In addition, a gate-in-panel (GIP) type liquid crystal display (LCD) device is completed using the array substrate and the color filter substrate through steps ST31 to ST33. The method of fabricating the GIP type LCD device will be illustrated with reference to FIGS. 3 to 6.

At step ST11, the gate line 113, the gate electrodes 115 and 116 and the clock line 117 are formed on the first substrate 110 by depositing a first metallic material and patterning a first metallic material layer. The gate line 113 and the gate electrode 115 for the pixel TFT Tp are disposed in the active area AA, and the clock line 117 and the gate electrode 116 for the driving TFT Td are disposed in the non-active area NA. The gate electrode 116 has a comb shape including the gate base portion 116a and the plurality of gate bar portions 116b extending from the gate base portion 116a. The plurality of gate bar portions 116b are spaced apart from each other. For the ratio of the open area to the whole area within a range of about 50% to about 60%, the first width w1 between two adjacent gate bar portions 116b is greater than or equal to the second width w2 of each gate bar portion 116b (w1≥w2). In addition, a gap distance between two adjacent gate electrodes 116 of the driving TFTs Td may be greater than or equal to the second width w2.

At step ST12, the gate insulating layer 121 is formed on the gate line 113, the gate electrodes 115 and 116 and the clock line 117 by depositing a first insulating material, and the semiconductor layers 123 and 124 are formed on the gate insulating layer 121 over the gate electrodes 115 and 116 by depositing amorphous silicon and impurity-doped amorphous silicon and patterning an amorphous silicon layer and an impurity-doped amorphous silicon layer. The semiconductor layer 123 for the pixel TFT Tp is disposed in the active area AA, and the semiconductor layer 124 for the driving TFT Tp is disposed in the non-active area NA. The semiconductor layer 124 includes the plurality of semiconductor bar portions 125 each having a plate shape and corresponding to each gate bar portion 116b. The plurality of semiconductor bar portions 125 are separated from each other to have an island shape.

At step ST13, the data line 128, the source electrodes 130 and 134, the drain electrodes 132 and 136 and the connection line 135 are formed on the gate insulating layer 121 and the semiconductor layers 123 and 124 by depositing a second metallic material and patterning a second metallic material layer. The data line 128 and the source and drain electrodes 130 and 132 for the pixel TFT Tp are disposed in the active area AA, the connection line 135 and the source and drain electrodes 134 and 136 are formed in the non-active area NA. The data line 128 crosses the gate line 113 to define the pixel region P. The source electrode 130 is connected to the data line 128 and the drain electrode 132 is spaced apart from the source electrode 130. The gate electrode 115, the semiconductor layer 123, the source electrode 130 and the drain electrode 132 constitute the pixel TFT Tp.

Each of the source and drain electrodes 134 and 136 has a comb shape. The source electrode 134 includes the source base portion 134a and the plurality of source bar portions 134b extending from the source base portion 134a, and the drain electrode 136 includes the drain base portion 136a and the plurality of drain bar portions 136b extending from the drain base portion 136a. The plurality of source bar portions 134b and the plurality of drain bar portions 136b are spaced apart from each other such that two adjacent source bar portions 134b are disposed at both sides of one drain bar portion 136b. The gate electrode 116, the semiconductor layer 124, the source electrode 134 and the drain electrode 136 constitute the driving TFT Td, which is used as an element of each circuit unit 148 of the gate driving circuit and the electrostatic discharge circuit. The connection line 135 crosses the clock line 117 and is connected to each circuit unit 148.

At ST14, the passivation layer 138 having the drain contact hole 141 and the connection contact hole 142 is formed on the data line 128, the source electrodes 130 and 134, the drain electrodes 132 and 136 and the connection line 135 by depositing a second insulating material and patterning a second insulating material layer. The drain contact hole 141 exposes the drain electrode 132 and the connection contact hole 142 exposes the clock line 117 and the connection line 135. The passivation layer 138 further includes a data pad contact hole (not shown) exposing one end portion of the data line 128 and a clock pad contact hole (not shown) exposing one end portion of the clock line 117. In addition, the passivation layer 138 may include additional contact holes exposing the source and drain electrodes 134 and 136.

At step ST15, the pixel electrode 143, the connection pattern 144, the data pad 146 and the clock pad 147 are formed on the passivation layer 138 by depositing a transparent conductive material and patterning a transparent conductive material layer. The pixel electrode 143 is connected to the drain electrode 132 through the drain contact hole 141, and the connection pattern 144 is connected to the clock line 117 and the connection line 135 through the connection contact hole 142. Accordingly, the clock line 117 and the connection line 135 are connected to each other through the connection pattern 144. The data pad 146 is connected to the data line 128 through the data pad contact hole, and the clock pad 147 is connected to the clock line 117 through the clock pad contact hole.

The column spacer 163 may be formed on the passivation layer 138 corresponding to the gate line 113 or the data line 128. Alternatively, the column spacer 163 may be formed on the common electrode 160 corresponding to the black matrix 153.

At step ST21, the black matrix 153 is formed on the second substrate 150 by depositing a third metallic material and patterning the third metallic material layer. The black matrix 153 includes a first black matrix 153a having openings in the active area AA and a second black matrix 153b in the non-active area NA.

At step ST22, the color filter layer 158 is formed on the black matrix 153 by coating a color resin, exposing a color resin layer and developing the exposed color resin layer. The color filter layer 158 includes the red, green and blue color filters 158a, 158b and 158c corresponding to the openings of the first black matrix 153a.

At step ST23, the common electrode 160 is formed on the second black matrix 153b in the non-active area NA and the color filter layer 158 in the active area AA by depositing a transparent conductive material.

At step ST31, after the array substrate and the color filter substrate are completed, the seal pattern 180 is formed on one of the first and second substrates 110 and 150 by coating a UV curable sealant. The seal pattern 180 has a closed rectangular loop shape and is disposed at an edge portion in the non-active area NA.

At step ST32, in a vacuum dispensing and attaching apparatus, the first and second substrates 110 and 150 are disposed to face into each other, and the liquid crystal layer 170 is formed inside the seal pattern 180 by dispensing a liquid crystal material. Next, the first and second substrates 110 and 150 are aligned to and attached to each other, and the seal pattern 180 is cured by irradiating the UV ray through the first substrate 110.

At ST33, the attached first and second substrates 110 and 150 are cut into the plurality of unit cells. As a result, the plurality of unit cells, each of which is used as a GIP type LCD device, are fabricated using the vacuum dispensing and attaching apparatus.

Figure 7:
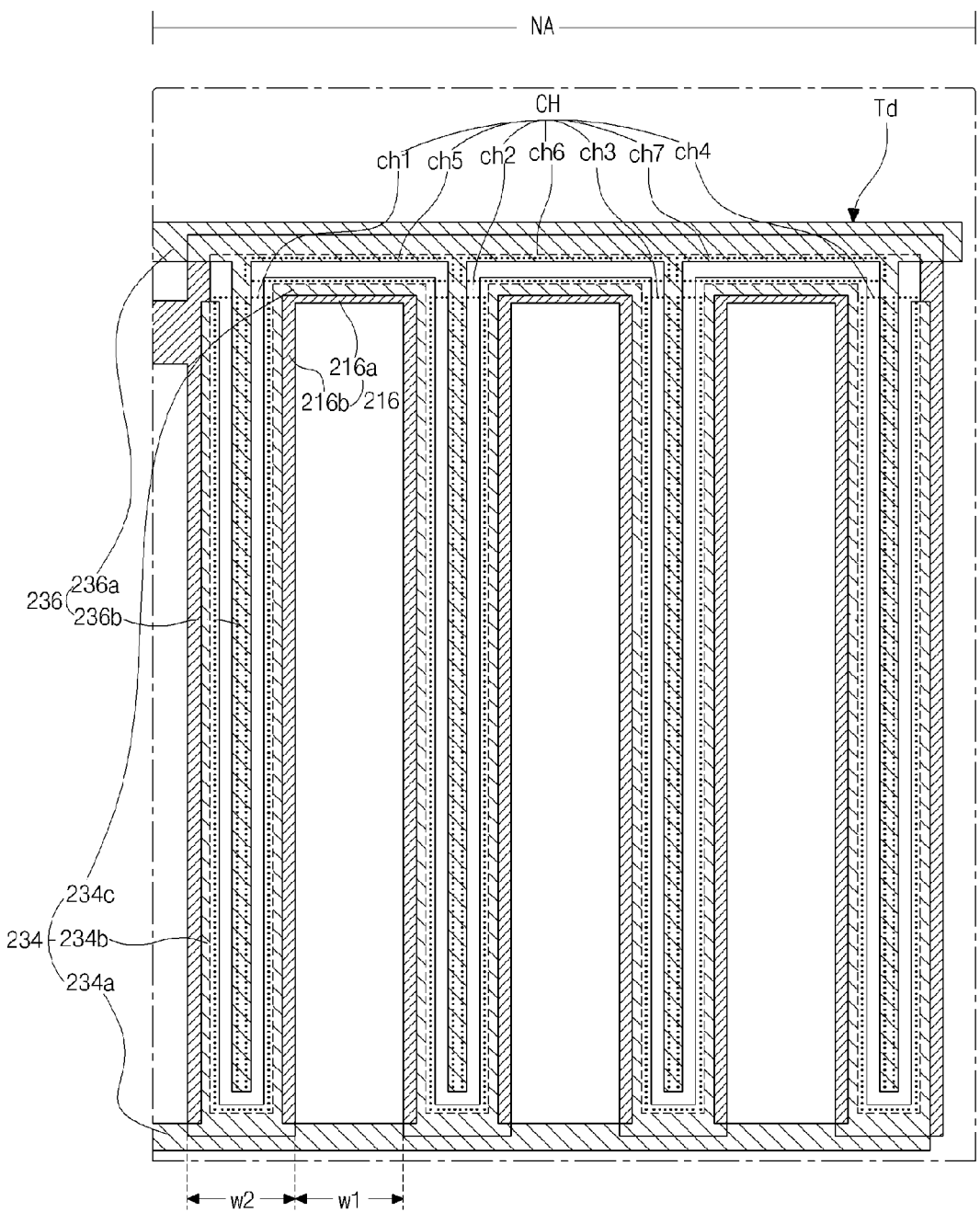
FIG. 7 is a plan view showing a driving thin film transistor of a gate-in-panel type liquid crystal display device according to another embodiment of the present invention.

FIG. 7 is a plan view showing a driving thin film transistor of a gate-in-panel type liquid crystal display device according to another embodiment of the present invention.

In FIG. 7, a driving thin film transistor (TFT) Td includes a gate electrode 216, a semiconductor layer 224, a source electrode 234 and a drain electrode 236. The gate electrode 216 has a comb shape including a gate base portion 216a and a plurality of gate bar portions 216b extending from the gate base portion 216a. The plurality of gate bar portions 216b are spaced apart from each other, and the gate base portion 216a connects the plurality of gate bar portions 216b. The semiconductor layer 224 includes a semiconductor base portion 224a and a plurality of semiconductor bar portions 224b. Each of the plurality of semiconductor bar portions 224b has a plate shape and corresponds to each gate bar portion 216b, and the semiconductor base portion 224a connects the plurality of semiconductor bar portions 224b and corresponds to the gate bar portion 216a. The source electrode 234 includes a source base portion 234a, a plurality of source bar portions 234b extending from the source base portion 234a and a plurality of source connecting portions 234c connecting adjacent source bar portions 234b. The drain electrode 236 has a comb shape including a drain base portion 236a and a plurality of drain bar portions 236b extending from the drain base portion 236a. The plurality of source bar portions 234b and the plurality of drain bar portions 236b are spaced apart from each other such that two adjacent source bar portions 234b are disposed at both sides of one drain bar portion 236b. Further, the drain base portion 236a faces and is spaced apart from each of the plurality of source connecting portions 234c to form an additional bar-shaped gap for channel.

The semiconductor layer 224 exposed through the two adjacent bar portions 234b and the one drain bar portion 236b and through each source connecting portion 234c and the drain base portion 236a is defined as a channel region CH for a current path. For example, the channel region CH may include first to seventh channels ch1, ch2, ch3, ch4, ch5, ch6 and ch7. Each of the first to fourth channels ch1, ch2, ch3 and ch4 has a U shape and each of the fifth to seventh channels ch5, ch6 and ch7 has a linear shape. A channel width of the channel region CH is a sum of the first to seventh channel width and a channel length of the channel region CH is an average of the first to seventh channel lengths. When each of the first to fourth channels ch1, ch2, ch3 and ch4 has a first width, each of the fifth to seventh channels ch5, ch6, ch7 has a second width and each of the first to seventh channels ch1, ch2, ch3, ch4, ch5, ch6 and ch7 has a first length, the channel width of the channel region CH is a sum of four times of the first width and three times of the second width, and the channel length of the channel region CH is the first channel length. As a result, the channel width of the driving TFT Td of FIG. 7 is enlarged as compared with the driving TFT Td of FIG. 4 by the three times of the channel width between each source connecting portion 234c and the drain base portion 236a. Accordingly, the non-active area of the first substrate is utilized more effectively.

Since the plurality of gate bar portions 216b of the gate electrode 216 are spaced apart from each other, a ratio of an open area that a UV ray penetrate to a whole area corresponding to the driving TFT Td is greater than or equal to about 50%. For example, the ratio of the open area to the whole area may be within a range of about 50% to about 60%. For the ratio of the open area to the whole area within a range of about 50% to about 60%, the gate electrode 216 is formed such that a first width between two adjacent gate bar portions 216b is greater than or equal to a second width of each gate bar portion. For example, the first width may be greater than the second width by a value within a range of about 0% to about 10% of the second width. Although not shown, a gap distance between two adjacent gate electrodes of the driving TFTs Td may be greater than or equal to the second width.

Consequently, in an array substrate for a GIP type LCD device according to an embodiment of the present invention, since the gate electrode of the driving TFT of the gate driving circuit on the first substrate has a comb shape including the gate base portion and the plurality of gate bar portions spaced apart from each other, the ratio of the open area that the UV ray can penetrate to the whole area where the gate driving circuit is disposed is within a range of about 50% to about 60%. Accordingly, the seal pattern is sufficiently cured by irradiating the UV through the first substrate, and the steps of forming the liquid crystal layer and attaching the first and second substrates are performed in the vacuum dispensing and attaching apparatus.

Since the GIP type LCD device is fabricated using the vacuum dispensing and attaching apparatus, the fabrication time is reduced and the productivity is improved. In addition, since the seal pattern is completely cured, the contamination due to insufficiently cured seal pattern is prevented and the production yield is improved.

It will be apparent to those skilled in the art that various modifications and variations can be made in an array substrate for a gate-in-panel type liquid crystal display device and a method of fabricating the array substrate of embodiments of the invention without departing from the spirit or scope of the invention. Thus, it is intended that embodiments of the invention cover the modifications and variations of this invention provided they come within the scope of the appended claims and their equivalents.

What is claimed:

1. A method of fabricating an array substrate for a liquid crystal display device comprising:
    forming a gate line, a first gate electrode and a second gate electrode on a substrate having an active area displaying images and a non-active area surrounding the active area, wherein the gate line and the first gate electrode connected to the gate line are disposed in the active area and the second gate electrode is disposed in the non-active area, and the second gate electrode having a gate base portion and a plurality of gate bar portions extending from the gate base portion;
    forming a gate insulating layer on the gate line, the first gate electrode and the second gate electrode;
    forming first and second semiconductor layers on the gate insulating layer, the first and second semiconductor layers corresponding to the first and second gate electrodes, respectively;
    forming a data line, a first source electrode, a first drain electrode, a second source electrode and a second drain electrode on the gate insulating layer and the first and second semiconductor layers, wherein the data line crosses the gate line, wherein the first source and drain electrodes correspond to the first semiconductor layer, and wherein the second source and drain electrodes correspond to the second semiconductor layer;
    forming a passivation layer on the data line, the first source electrode, the first drain electrode, the second source electrode and the second drain electrode, the passivation layer having a drain contact hole exposing the first drain electrode; and
    forming a pixel electrode on the passivation layer, the pixel electrode connected to the first drain electrode through the drain contact hole.

* * * * *